(12) United States Patent
Hsu

(10) Patent No.: US 9,070,493 B2
(45) Date of Patent: Jun. 30, 2015

(54) WIRE STRUCTURE AND METHOD FOR DESIGNING THE SAME

(75) Inventor: Jung-Hui Hsu, New Taipei (TW)

(73) Assignee: POWERTECH INDUSTRIAL CO., LTD., New Taipei (TW)

( * ) Notice: Subject to any disclaimer, the term of this patent is extended or adjusted under 35 U.S.C. 154(b) by 449 days.

(21) Appl. No.: 13/494,780

(22) Filed: Jun. 12, 2012

(65) Prior Publication Data

US 2013/0020108 A1 Jan. 24, 2013

(30) Foreign Application Priority Data

Jul. 22, 2011 (TW) .............................. 100126032 A
May 4, 2012 (TW) .............................. 101116102 A

(51) Int. Cl.
| | | |
|---|---|---|
| A01H 5/02 | (2006.01) | |
| C23C 28/02 | (2006.01) | |
| C25D 5/10 | (2006.01) | |
| H01B 7/29 | (2006.01) | |
| H01B 11/06 | (2006.01) | |
| H01B 5/08 | (2006.01) | |
| H01B 5/10 | (2006.01) | |
| H02G 5/00 | (2006.01) | |
| H01L 39/24 | (2006.01) | |
| H01B 7/42 | (2006.01) | |
| H01B 7/00 | (2006.01) | |

(52) U.S. Cl.
CPC ........... *H01B 7/421* (2013.01); *Y10T 29/49117* (2015.01); *H01B 7/0009* (2013.01)

(58) Field of Classification Search
CPC ........ H01B 7/0009; H01B 7/30; H01B 7/365; H01B 7/42; H01B 7/421; H01B 7/426; H01B 7/428; H01B 11/04; H01R 4/188

USPC .......... 174/19, 36, 74 R, 94 R, 110 R, 113 R, 174/115, 119 R, 129 R, 133 R; 29/599; 505/929, 930

See application file for complete search history.

(56) References Cited

U.S. PATENT DOCUMENTS

| | | | | |
|---|---|---|---|---|
| 268,157 | A * | 11/1882 | Waring ..................... | 174/119 R |
| 292,772 | A * | 1/1884 | Van Hoevenbergh .... | 174/113 R |
| 6,769,923 | B2 * | 8/2004 | Caldwell ........................ | 439/74 |
| 6,967,289 | B2 * | 11/2005 | Goto ......................... | 174/129 R |
| 7,479,597 | B1 | 1/2009 | Cases et al. | |
| 2009/0025960 | A1 * | 1/2009 | Kashio ......................... | 174/250 |

FOREIGN PATENT DOCUMENTS

| | | |
|---|---|---|
| CN | 201000782 Y | 1/2008 |
| JP | H0689614 A | 3/1994 |
| KR | 20050114575 A | 12/2005 |

OTHER PUBLICATIONS

China Patent Office, Office action issued on Oct. 10, 2014.

* cited by examiner

*Primary Examiner* — Chau N Nguyen
*Assistant Examiner* — Roshn Varghese
(74) *Attorney, Agent, or Firm* — Li & Cai Intellectual Property (USA) Office

(57) ABSTRACT

A wire structure defined between a first plane and a second plane is provided. The first plane and the second plane are parallel to each other. The wire structure includes a main body and at least three convex portions. The main body has a center defined by its centroid and a periphery defined by the perimeter of the main body. The convex portions protrude from and are adjacently arranged around the periphery. At least one convex portion is tangent to the first plane, and at least two convex portions are tangent to the second plane. The number of the at least one convex portion tangent to the first plane is not equal to the number of the at least two convex portions tangent to the second plane.

14 Claims, 14 Drawing Sheets

US 9,070,493 B2

WIRE STRUCTURE AND METHOD FOR DESIGNING THE SAME

BACKGROUND OF THE INVENTION

1. Technical Field

The present invention relates to a wire structure. More particularly, the present invention relates to a wire structure and a design method thereof, wherein enhanced heat dissipation is achieved in the micron scale by an irregular shape design and by changing the surface area as appropriate.

2. Description of Related Art

The continuous improvement of technology has given rise to a plethora of electric appliances and electronic products. An electronic product typically requires a plurality of wires for transmitting signals and thereby achieving the intended hardware and software objectives.

Conventionally, a wire structure depends on an external heat exchange structure, such as a fan or fins, to dissipate heat, and the purpose of providing the additional heat exchange structure is to increase the efficiency of heat transfer.

However, when wire structures are downsized to the micron scale (about 0.010 to 0.999 mm), the issue of heat dissipation differs substantially from that of the traditional wires, which are in the millimeter scale (about 1 to 2 mm). This difference can be accounted for by the fact that heat transfer in different scales features different heat dissipation effects. Besides, the additional heat dissipation structures incur extra costs and occupy considerable space, which is highly undesirable.

U.S. Pat. No. 7,479,597 discloses a wire structure whose cross section is defined by a closed curve composed of three to eight convex portions and an equal number of concave portions. The radii of curvature of the convex portions and of the concave portions are less than one sixth of the overall radius of the closed curve. The radius of the cross section of the wire ranges from 2 mm to 10 mm. Moreover, the radii of curvature of the convex portions and of the concave portions can be less than 0.1 mm.

It is well known that the heat dissipation effect of a wire varies with the surface area of the wire structure. If the dimensions of the wire structure of the '597 patent are markedly reduced (e.g., to one tenth, one hundredth, or even one thousandth), the perimeter of the closed curve will become so small that an increase in the surface area of the wire structure is unattainable by the design of the convex portions and the concave portions, and poor heat dissipation follows. If, however, an additional heat exchanger is used for more efficient heat dissipation, the convenience of use of the electric appliance in which the wire structure, and hence the heat exchanger, are provided will be compromised. Therefore, it is a pressing issue to improve heat transfer of relatively small wire structures.

BRIEF SUMMARY OF THE INVENTION

The present invention relates to a method for designing a wire structure, wherein the method includes the steps of: setting N radial lines, setting a circular design line, and designing N identical convex portions. As a wire structure thus designed can dissipate heat efficiently despite its relatively small size, the cost and space otherwise required for the installation of a heat exchanger can be saved.

The primary objective of the present invention is to increase the heat dissipation efficiency of a micron-scale wire structure.

Another objective of the present invention is to reduce costs and save space.

To achieve the above and other objectives, the present invention provides another wire structure defined between a first plane and a second plane parallel to the first plane. The wire structure includes a main body and at least three convex portions. The main body includes a center and a periphery. The center is defined by the centroidal axis of the main body, and the periphery, by the perimeter of the main body. The convex portions protrude from and are adjacently arranged around the periphery. At least one of the convex portions is tangent to the first plane, and at least two of the convex portions are tangent to the second plane. The number of the at least one convex portion tangent to the first plane is not equal to the number of the at least two convex portions tangent to the second plane. Furthermore, each convex portion is defined by a circular arc, which in turn is defined by a third radius (R2), and the plural convex portions are tangent to an externally tangent circle defined by a first radius (R1) greater than or equal to twice the third radius (R2).

In either of the foregoing wire structures, each convex portion is or may be defined by a circular arc, bend points may be formed in the cross section of the wire structure at junctions between the convex portions and an exposed portion of the periphery, the number of the convex portions may be an odd number, the convex portions may be asymmetrically distributed about the center, or each two adjacent convex portions may or may not be in contact with each other.

The present invention further provides a method for designing a wire structure, and the method is carried as follows. To begin with, N radial lines are set, wherein the radial lines radiate equiangularly outward from the center of the cross section of a wire main body. Then, a circular design line is set, whose center of circle is defined by the center of the cross section of the wire main body and whose first radius is R1. Following that, N identical convex portions are designed, wherein the cross section of each convex portion is bilaterally symmetric with respect to a corresponding one of the radial lines, and each convex portion is an outward extension of the wire main body. Additionally, the distance between the centroid of the cross section of each convex portion and the center of the cross section of the wire main body is the same, and the cross section of each convex portion has an apex in contact with the circular design line and located on the corresponding radial line. N is an odd number greater than or equal to three.

The present invention also provides a wire structure designed by the foregoing method.

Implementation of the present invention at least achieves the following advantageous effects:

1. A wire structure capable of efficient heat dissipation is formed; and

2. As the physical limitations imposed by miniature dimensions on heat transfer are overcome, the cost and space otherwise required for installing a heat exchanger can be saved.

Hereinafter, the detailed features and advantages of the present invention are described in detail by way of the preferred embodiments of the present invention so as to enable persons skilled in the art to gain insight into the technical disclosure of the present invention, implement the present invention accordingly, and readily understand the objectives and advantages of the present invention by making reference to the disclosure of the specification, the claims, and the drawings of the present invention.

DETAILED DESCRIPTION OF THE INVENTION

First Embodiment

Figure 1:
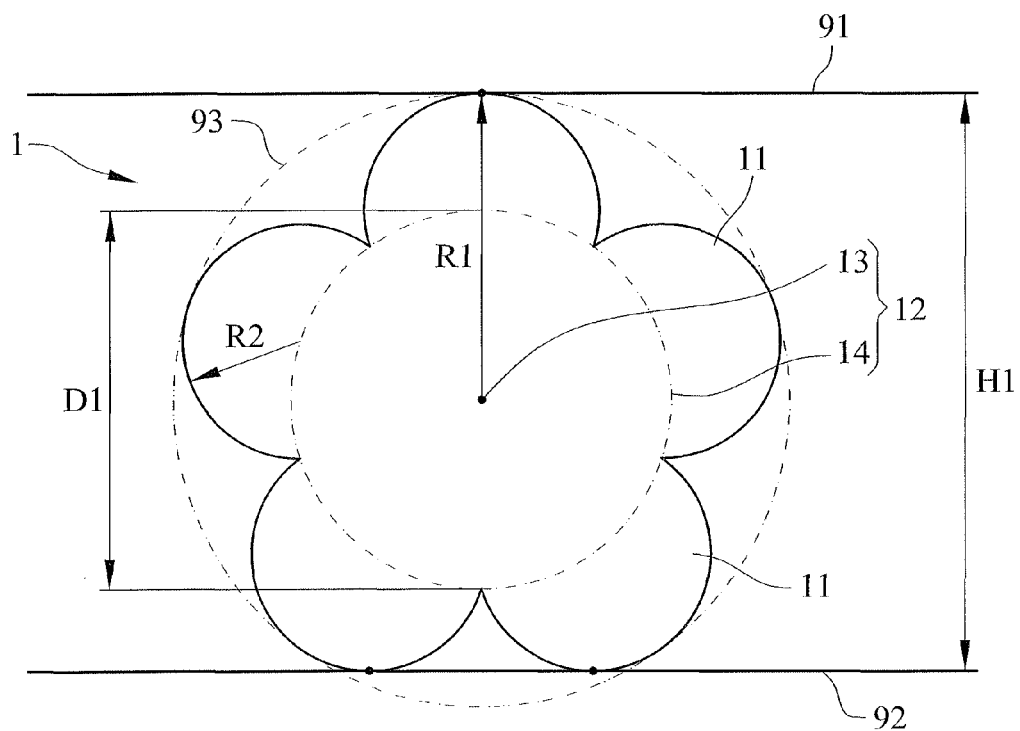
FIG. 1 is a schematic drawing of the wire structure according to the first embodiment of the present invention.

Please refer to FIG. 1 for a schematic drawing of the wire structure according to the first embodiment of the present invention or, more particular, a sectional view the wire structure 1. As shown in FIG. 1, the wire structure 1 is defined between a first plane 91 and a second plane 92 parallel to the first plane 91. The wire structure 1 includes a main body 12 and five convex portions 11. The main body 12 is composed of a center 13 and a periphery 14. The center 13 is defined by the centroidal axis (i.e., geometric center axis) of the main body 12. The periphery 14 is defined by the perimeter of the main body 12 and forms the boundary of the main body 12. In this embodiment, the cross section of the main body 12 is a perfect circle, so the centroid of the cross section of the main body 12 is the center of circle of the cross section of the main body 12. At least three (for example, five) convex portions 11 protrude from and are adjacently arranged around the periphery 14. The uppermost convex portion 11 is tangent to the first plane 91 while the two lowest convex portions 11 are simultaneously tangent to the second plane 92. Hence, the number of the convex portion 11 tangent to the first plane 91 is not equal to the number of the convex portions 11 tangent to the second plane 92. In this embodiment, the total number of the convex portions 11 is an odd number, and the convex portions 11 are symmetrically distributed about the center 13. By "symmetrically distributed" it is meant that the five convex portions 11 are evenly distributed along the 360° circumference around the center 13. Therefore, each convex portion 11 spans 72° (360°÷5=72°). In addition, each two adjacent convex portions 11 are in contact with each other.

The cross section of the periphery 14 is a perfect circle defined by a base diameter D1, and the plural convex portions 11 are tangent to an externally tangent circle 93 defined by a first radius R1, wherein the base diameter D1 is less than the first radius R1. The cross section of each convex portion 11 is defined by a circular arc which in turn is defined by a third radius R2. The first plane 91 and the second plane 92 define a distance H1. The plural convex portions 11 of the wire structure 1 are tangent to the first plane 91 and the second plane 92 such that the wire structure 1 is vertically sandwiched between the first plane 91 and the second plane 92. In order to enhance heat dissipation from the small-sized (micron-scale) wire structure 1, the inventor of the present invention conducted numerous experiments and found the following. The wire structure 1 in this embodiment can dissipate heat efficiently when: the first radius R1 of the externally tangent circle 93 is less than 0.134 mm, the third radius R2 of the circular arc is between 0.045 and 0.0475 mm, the distance H1 between the first plane 91 and the second plane 92 is between 0.125 and 2.01 mm, and the first radius R1 is greater than or equal to twice the third radius R2 (i.e., R1≥2R2). By satisfying the above conditions, the hair-like wire structure 1 (i.e., with R1<0.134 mm) is significantly enhanced in heat dissipation efficiency and is prevented from melting or burning which may otherwise result from an excessively high temperature. It should be noted that the externally tangent circle 93 is an imaginary circle provided only to better explain the structural features of the wire structure 1 and is not a physical element of the wire structure 1.

Second Embodiment

Figure 2:
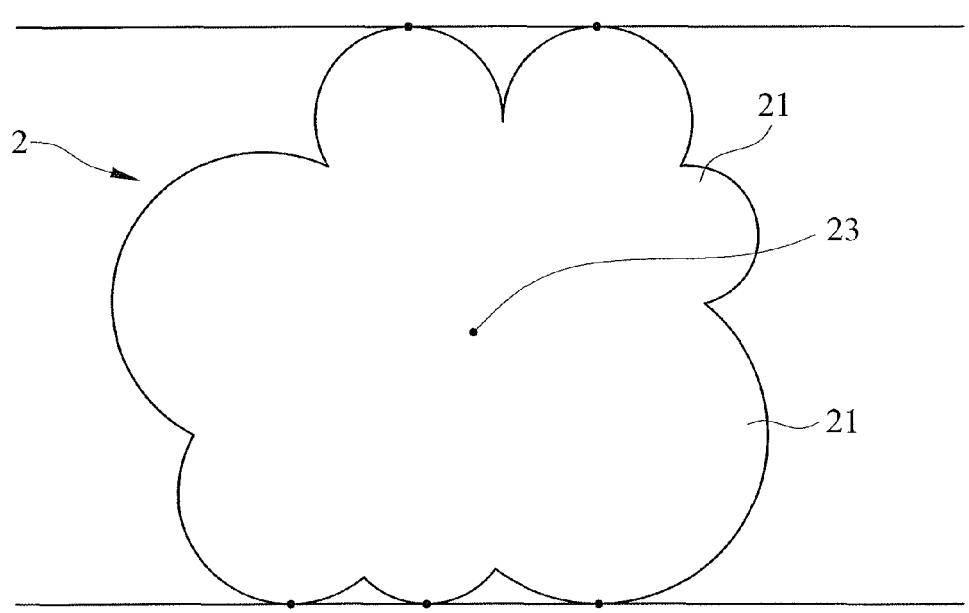
FIG. 2 is a schematic drawing of the wire structure according to the second embodiment of the present invention.

It is understood that the present invention can be implemented in many other ways as well. Please refer to FIG. 2 for a schematic drawing of the wire structure according to the second embodiment of the present invention. As shown in FIG. 2, the wire structure 2 has seven (again an odd number) convex portions 21. The two uppermost convex portions 21 are tangent to the first plane 91 while the three lowest convex portions 21 are tangent to the second plane 92. Therefore, the number of the convex portions 21 tangent to the first plane 91 is not equal to the number of the convex portions 21 tangent to the second plane 92. In this embodiment, the convex portions 21 are asymmetrically distributed about the center 23. By "asymmetrically distributed" it is meant that the seven convex portions 21 are either different in size or differently spaced from the center 23 such that the seven convex portions 21 cannot be evenly distributed along the 360° circumference around the center 23. As a result, a different included angle is formed between each two adjacent convex portions 21. Besides, each two adjacent convex portions 21 are in contact with each other.

Third Embodiment

Figure 3:
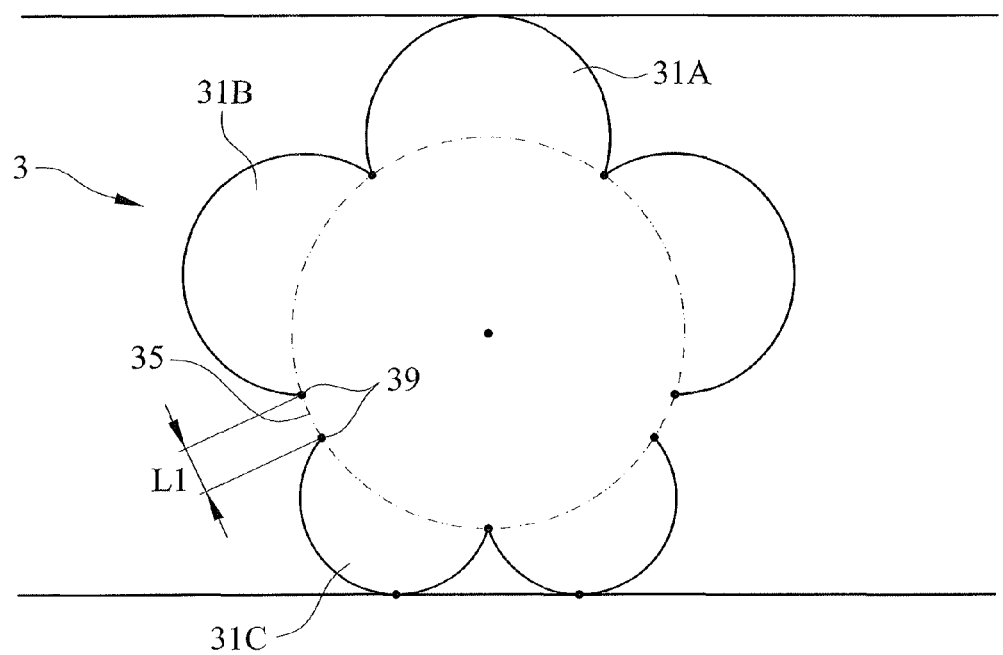
FIG. 3 is a schematic drawing of the wire structure according to the third embodiment of the present invention.

FIG. 3 schematically shows the wire structure according to the third embodiment of the present invention. As shown in FIG. 3, the wire structure 3 includes five convex portions. The convex portions 31A and 31B are adjacent to and in contact with each other, whereas the convex portions 31B and 31C are adjacent to but not in contact with each other. In consequence, the periphery 35 has an exposed portion between the convex portions 31B and 31C. The junction between the convex portion 31B and the exposed portion of the periphery 35 is shown in FIG. 3 as a bend point 39, and the junction between the convex portion 31C and the exposed portion of the periphery 35, as another bend point 39. The convex portions 31B and 31C are spaced by a spacing L1. In this embodiment, not only do the convex portions increase the surface area for heat dissipation, but also the exposed portion of the periphery 35 serves to dissipate heat. The experiments conducted by the inventor of the present invention show that the exposed portion of the periphery 35 can dissipate heat efficiently when the spacing L1 is between 0.012 and 0.021 mm.

Fourth Embodiment

Figure 4:
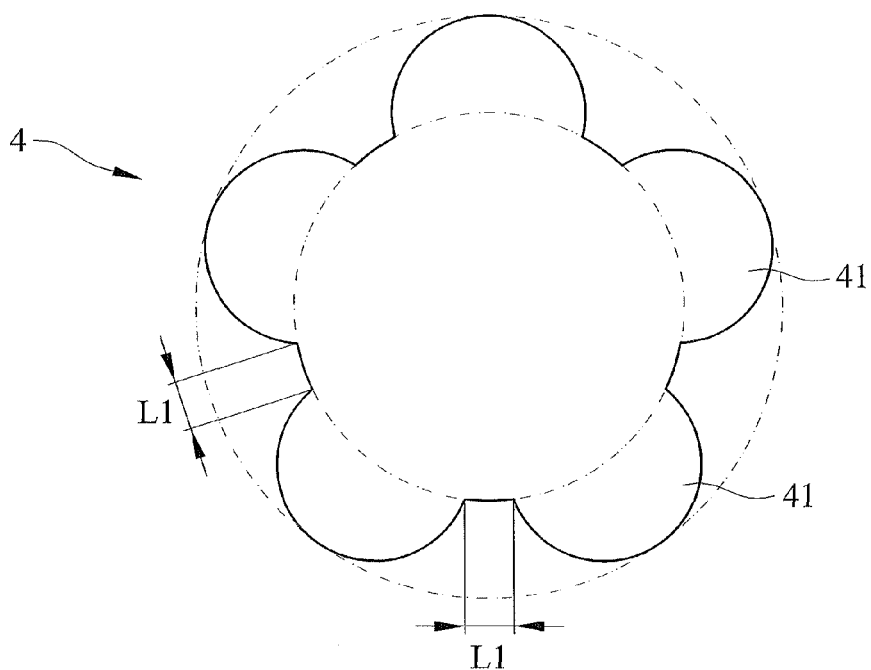
FIG. 4 is a schematic drawing of the wire structure according to the fourth embodiment of the present invention.

Please refer to FIG. 4 for a schematic drawing of the wire structure according to the fourth embodiment of the present invention. The wire structure 4 in FIG. 4 has five convex portions 41, each two adjacent ones of which are separate from each other. Hence, five spacings L1 are defined and are preferably equal to facilitate manufacture. However, the five spacings L1 may also be unequal in applications with particular heat dissipation conditions.

Fifth and Sixth Embodiments

Figure 5:
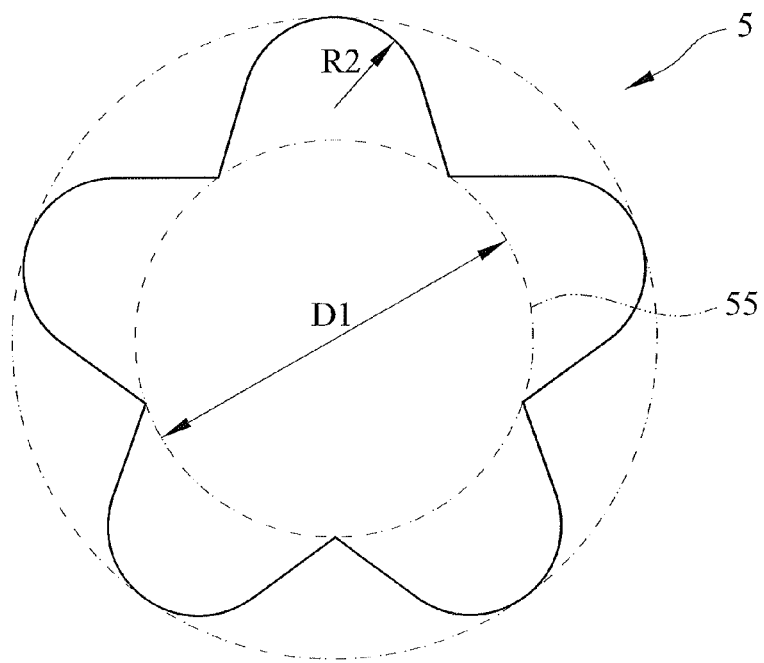
FIG. 5 is a schematic drawing of the wire structure according to the fifth embodiment of the present invention.
Figure 6:
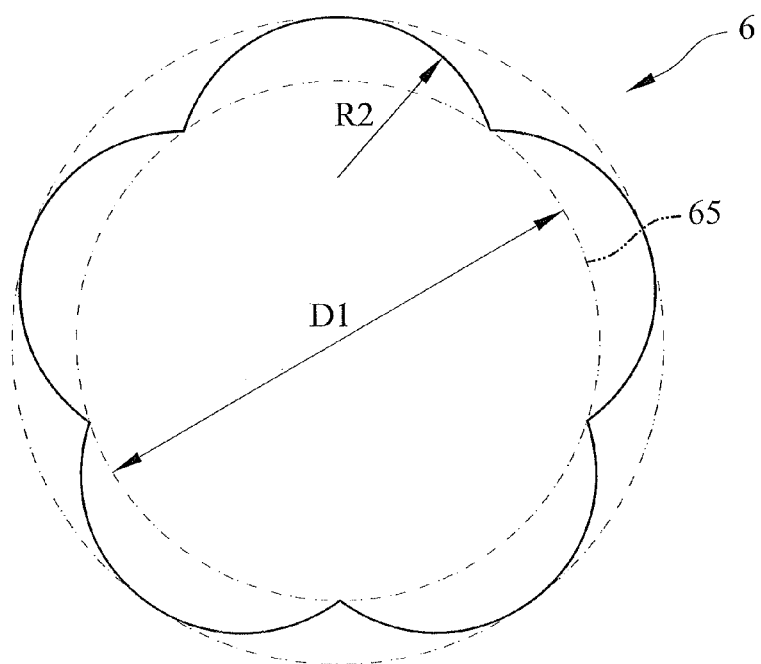
FIG. 6 is a schematic drawing of the wire structure according to the sixth embodiment of the present invention.

FIGS. 5 and 6 are schematic drawings of the wire structures according to the fifth and the sixth embodiments of the present invention respectively. The periphery 55 of the wire structure 5 in FIG. 5 is smaller in cross section than the periphery 65 of the wire structure 6 in FIG. 6. In other words, the base diameter D1 in FIG. 5 is less than the base diameter D1 in FIG. 6. Furthermore, the third radius R2 in FIG. 5 is less than the third radius R2 in FIG. 6.

Seventh Embodiment

Figure 7:
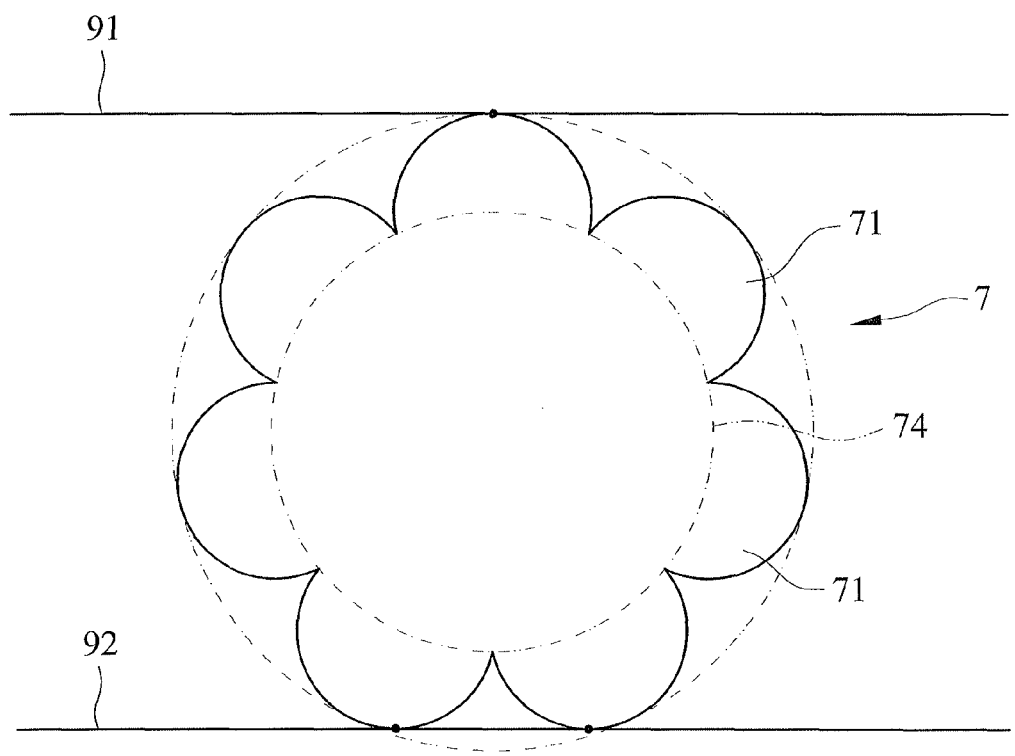
FIG. 7 is a schematic drawing of the wire structure according to the seventh embodiment of the present invention.

FIG. 7 schematically shows the wire structure according to the seventh embodiment of the present invention. In FIG. 7, the seven convex portions 71 of the wire structure 7 are evenly distributed along the periphery 74. The uppermost convex portion 71 is tangent to the first plane 91 while the two lowest convex portions 71 are tangent to the second plane 92. Besides, the seven convex portions 71 are identical in both shape and size.

Figure 8:
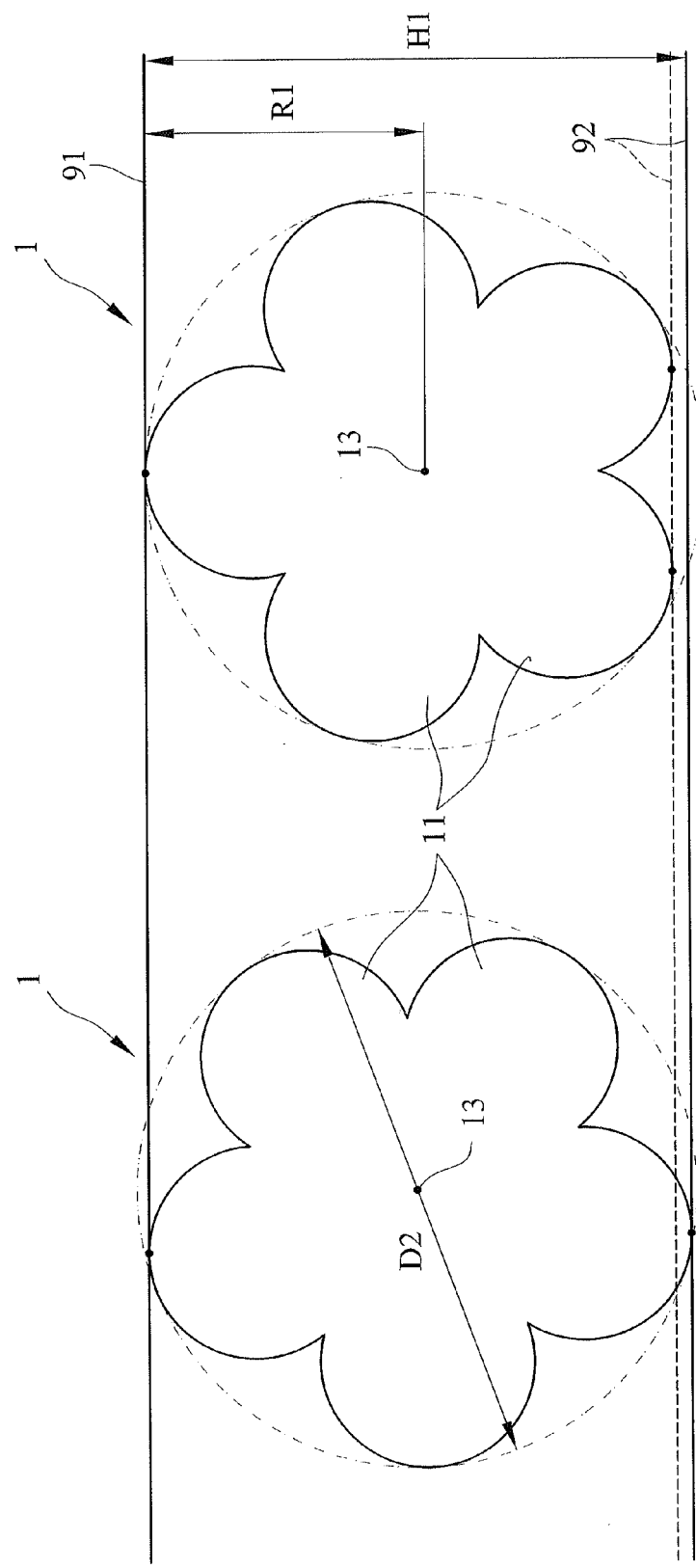
FIG. 8 is a schematic drawing showing a measurement error of the wire structure of the present invention.

As demonstrated by the structures in the foregoing embodiments, the present invention can substantially enhance thermal diffusion and convection of a wire structure by increasing its surface area and thus prevent it from experiencing an exceedingly high temperature during operation and signal transmission. Here, the issue of heat dissipation from a hair-like wire structure (micron-scale, about 0.010 to 0.999 mm) differs substantially from that of a conventional wire (millimeter-scale, about 1 to 2 mm), and this is because heat transfer in different scales is accompanied by diverse heat dissipation effects. It is therefore necessary to describe in detail the measurement of the wire structure of the present invention. Please refer to FIG. 8 for a schematic drawing showing a measurement error of the wire structure of the present invention. As shown in the drawing, the first plane 91 and the second plane 92 are spaced by the distance H1. Once the wire structure 1 is rotated about the center 13, the position of the second plane 92 is changed accordingly; therefore, the distance H1 is not a fixed value. However, with the wire structure 1 as fine as a hair, it is impossible to visually determine the orientation of the plural convex portions 11 of the wire structure 1. If the diameter D2 of the externally tangent circle of the wire structure 1 is to be measured by measuring the distance H1 between the first plane 91 and the second plane 92, the variable distance H1 may not give an accurate measurement of the diameter D2. In other words, an error is very likely to exist between the distance H1 and the diameter D2. Nevertheless, the experiments conducted by the inventor of the present invention show that the error between the distance H1 and the diameter D2 is less than 3% in all the aforesaid embodiments of the present invention. By definition, the diameter D2 of the externally tangent circle is equal to twice the aforesaid first radius R1 of the externally tangent circle.

To sum up, the foregoing limitations in dimensions and configuration help increase the heat dissipation efficiency of the micron-scale wire structure of the present invention. The enhanced heat dissipation capability, in turn, lends the wire structure great commercial potential in practical use.

Figure 9:
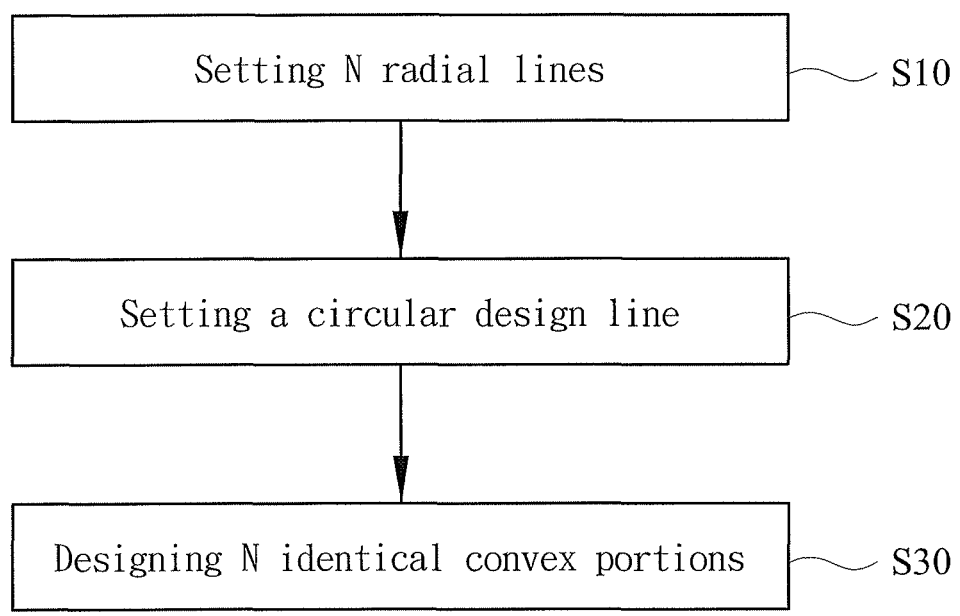
FIG. 9 is the flowchart of the method for designing a wire structure according to an embodiment of the present invention.

The embodiment shown in FIG. 9 is a method for designing a wire structure (S100), wherein the method includes the steps of: setting N radial lines (step S10), setting a circular design line (step S20), and designing N identical convex portions (step S30).

Figure 10:
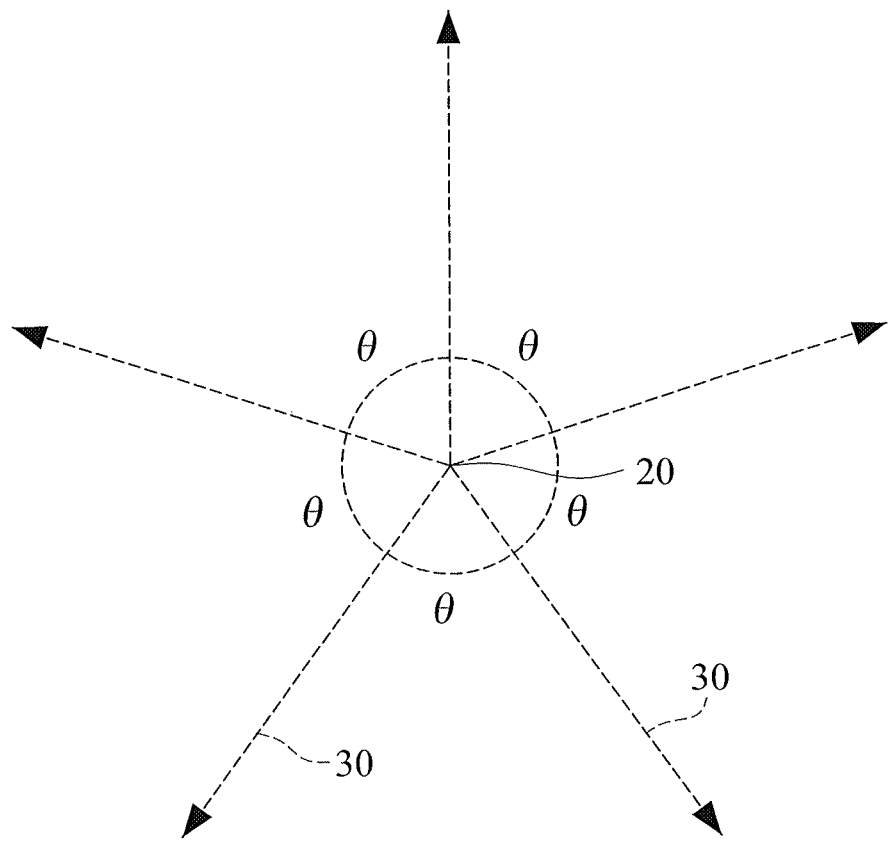
FIG. 10 schematically shows how N radial lines are set according to an embodiment of the present invention.

The step of setting N radial lines (step S10) is now detailed with reference to FIG. 10. To start with, the center 20 of the cross section of a wire main body is set. Then, lines are drawn radially outward from the center 20 to form N radial lines 30 which are equally angularly spaced. In other words, the included angle θ between each two adjacent radial lines 30 is the same. The number N is an odd number greater than or equal to three and is five in this embodiment. In practice, however, N may also be three, seven, or an odd number not less than nine.

Figure 11:
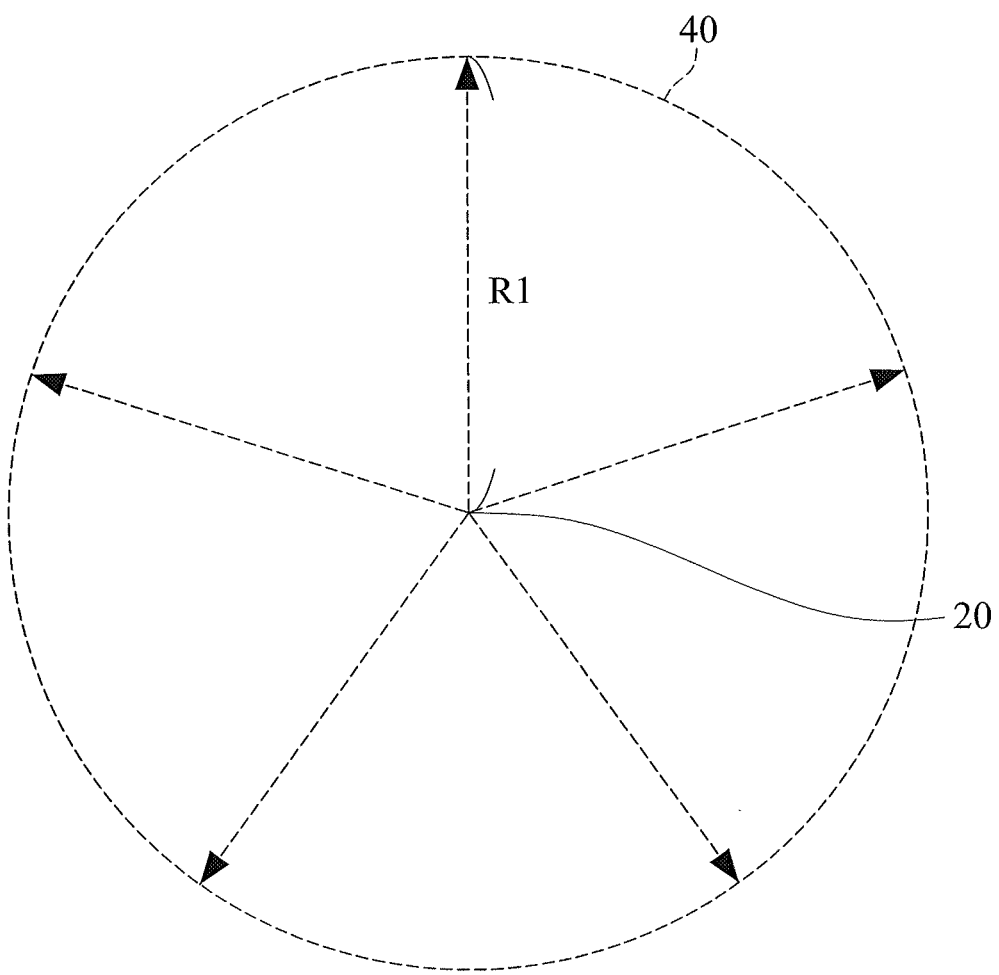
FIG. 11 schematically shows how a circular design line is set according to an embodiment of the present invention.

The step of setting a circular design line (step S20) is carried out as follows. Using the center 20 as the center of circle, the circular design line 40 is drawn with a first radius R1, as shown in FIG. 11.

Figure 12:
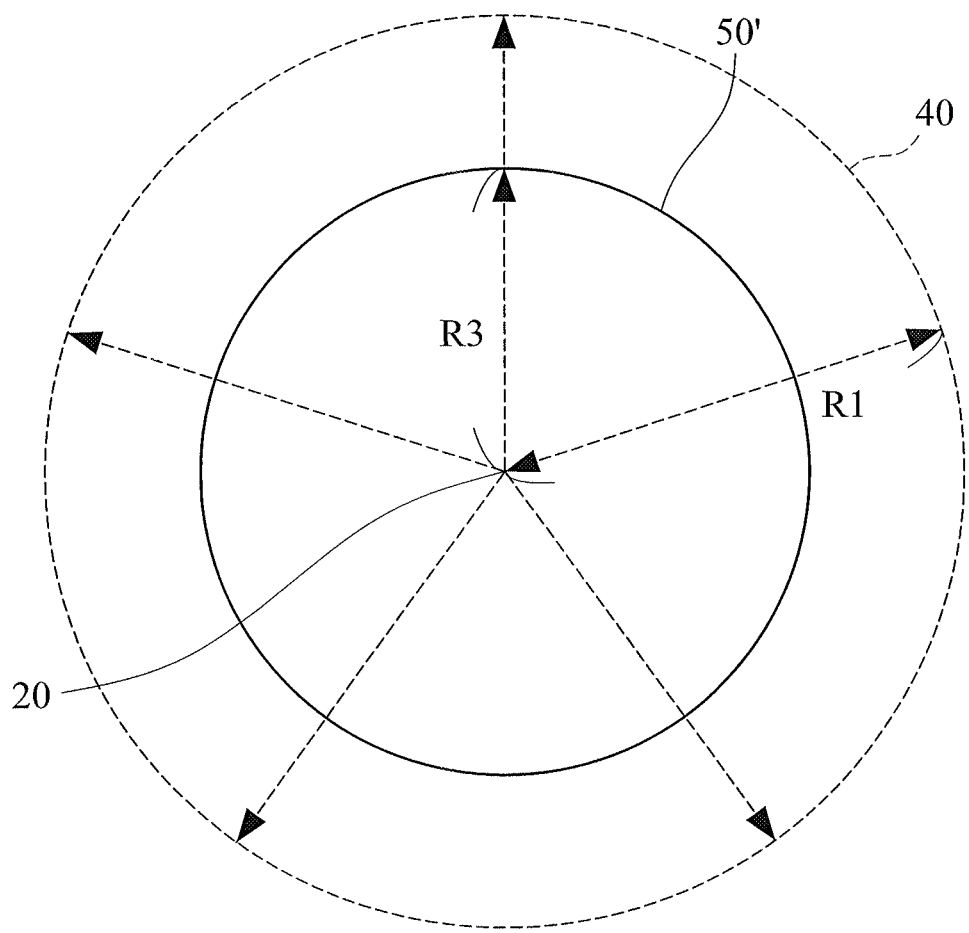
FIG. 12 schematically shows how a wire main body is designed according to an embodiment of the present invention.
Figure 13:
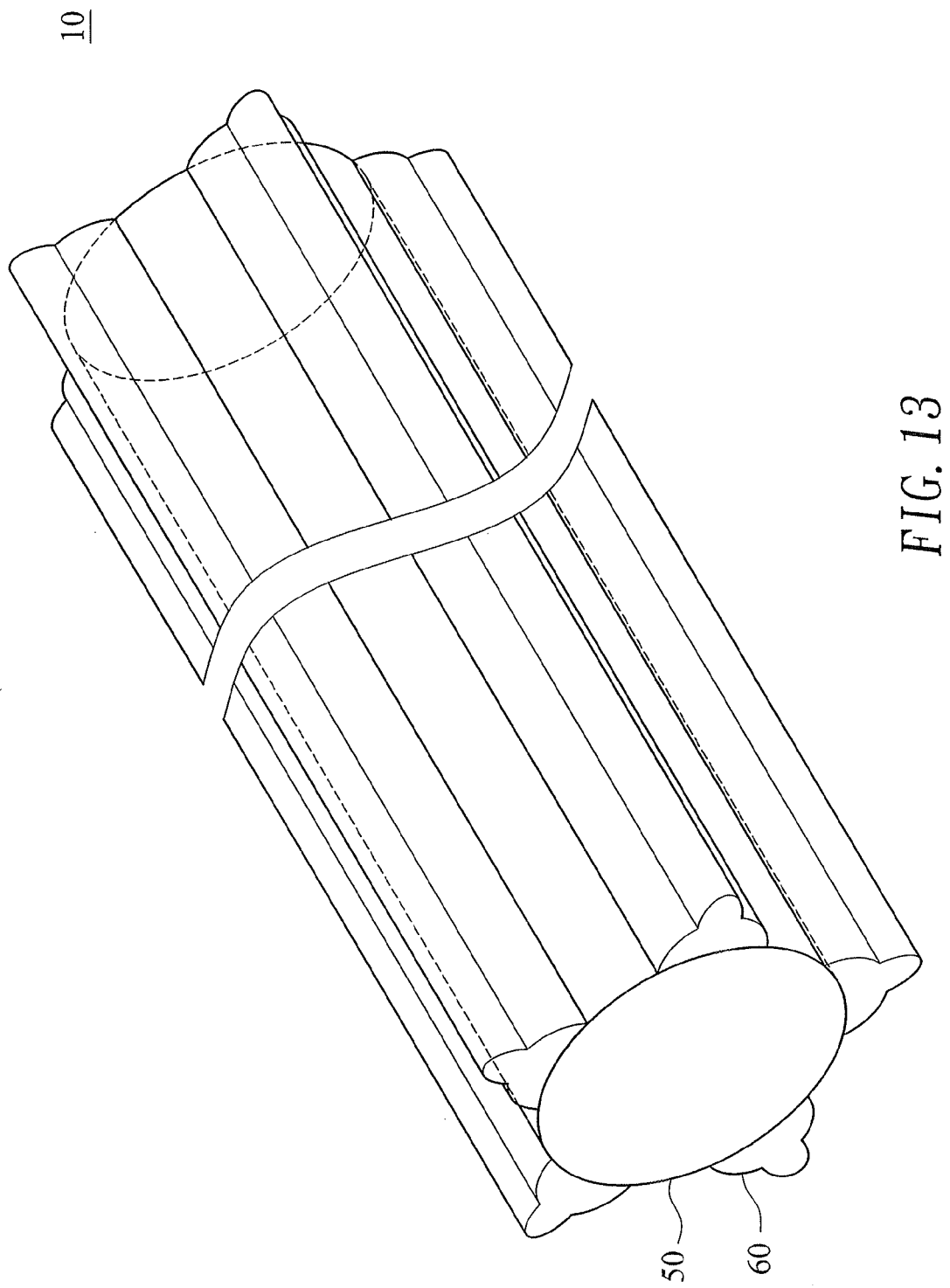
FIG. 13 is a perspective view of the wire structure according to an embodiment of the present invention.

After the circular design line is set (step S20), the wire main body is designed as shown in FIGS. 12 and 13. To begin with, a circle for defining the cross section 50' of the wire main body is drawn, wherein the center 20 serves as the center of circle of the cross section 50', and the second radius is R3. R1 is greater than R3. Then, based on the cross section 50', a cylindrical main body is designed as the wire main body 50.

Next, referring to FIG. 13, N identical convex portions are designed in step S30, wherein each convex portion 60 is an outward extension of the wire main body 50.

Figure 14:
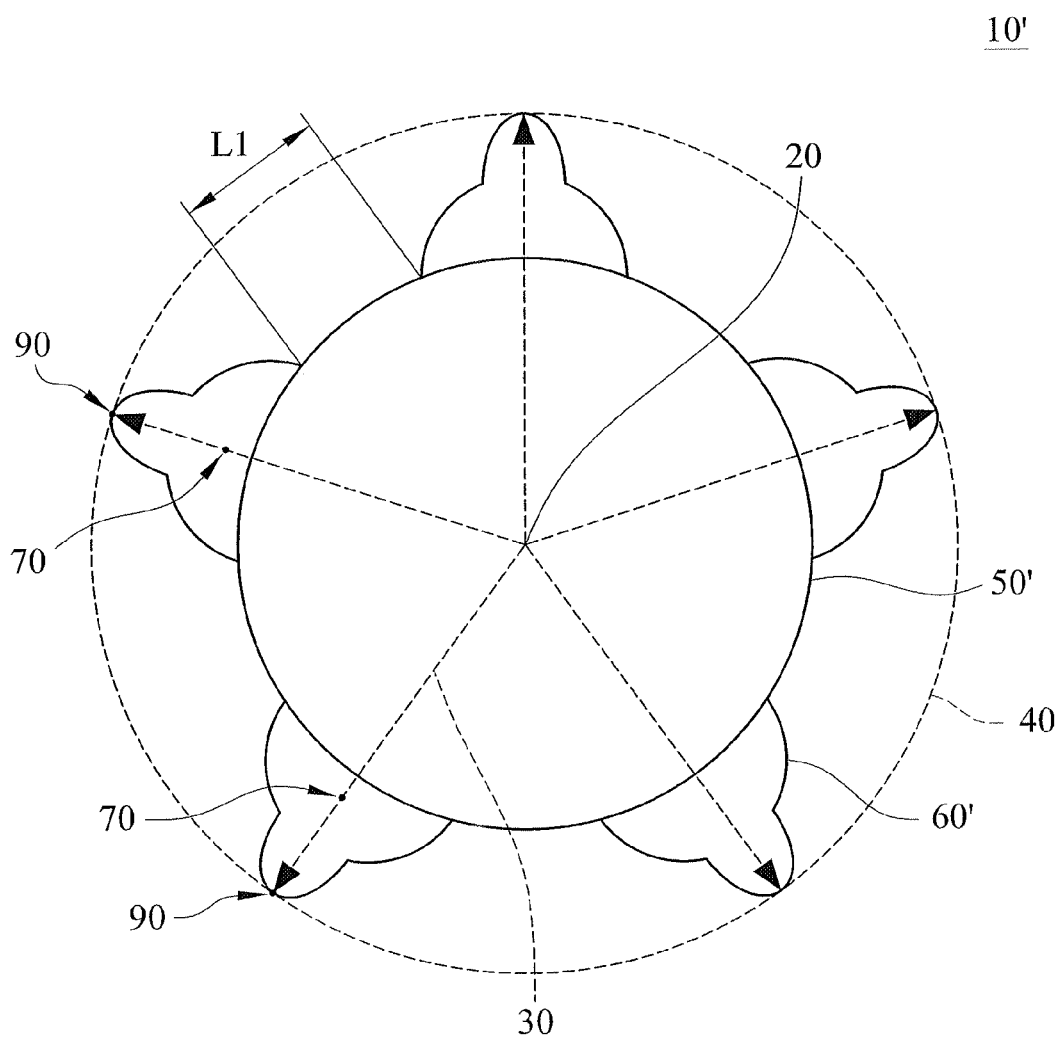
FIG. 14 schematically shows the first aspect of the N identical convex portions designed according to the present invention.

More specifically, referring to the sectional view of FIG. 14, each radial line 30 serves as the center line of the cross section 60' of one convex portion. Therefore, the cross section 60' of each convex portion is bilaterally symmetric with respect to the corresponding radial line 30. In other words, the left half of the cross section 60' of each convex portion is a mirror image of the right half with respect to the corresponding radial line 30. Moreover, the cross section 60' of each convex portion has an apex 90 in contact with the circular design line 40 and located on the corresponding radial line 30.

To put it differently, if the radial lines 30 extend to the circular design line 40, the radial lines 30 and the circular design line 40 will intersect at the apexes 90. Besides, when designing the N identical convex portions (step S30), the centroid 70 of the cross section 60' of each convex portion is positioned on the corresponding radial line 30 such that the shortest distances between each centroid 70 and the center 20 are the same. Consequently, the shortest distances between each centroid 70 of the cross section 60' of each convex portion and the circular design line 40 are also the same.

Figure 15:
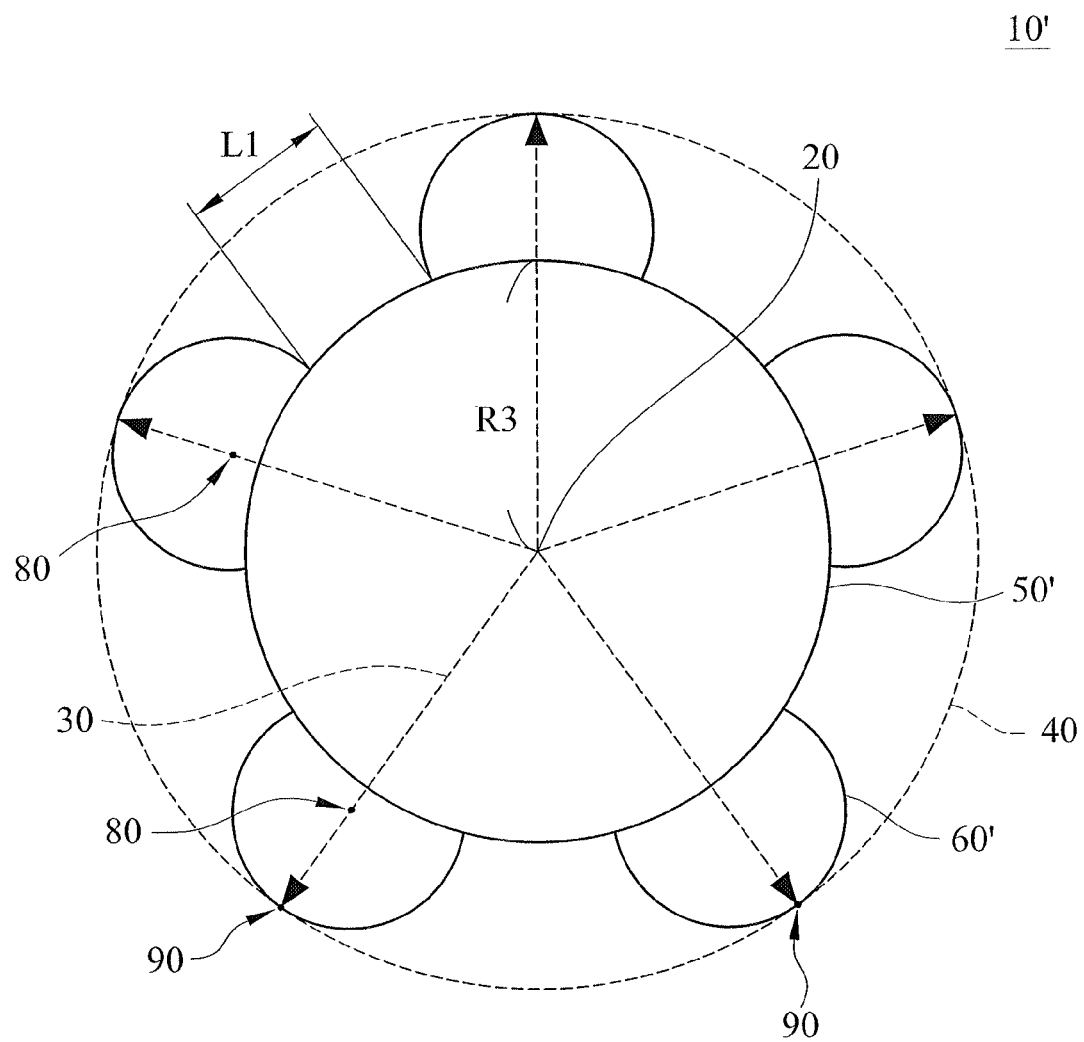
FIG. 15 schematically shows the second aspect of the N identical convex portions designed according to the present invention.
Figure 16:
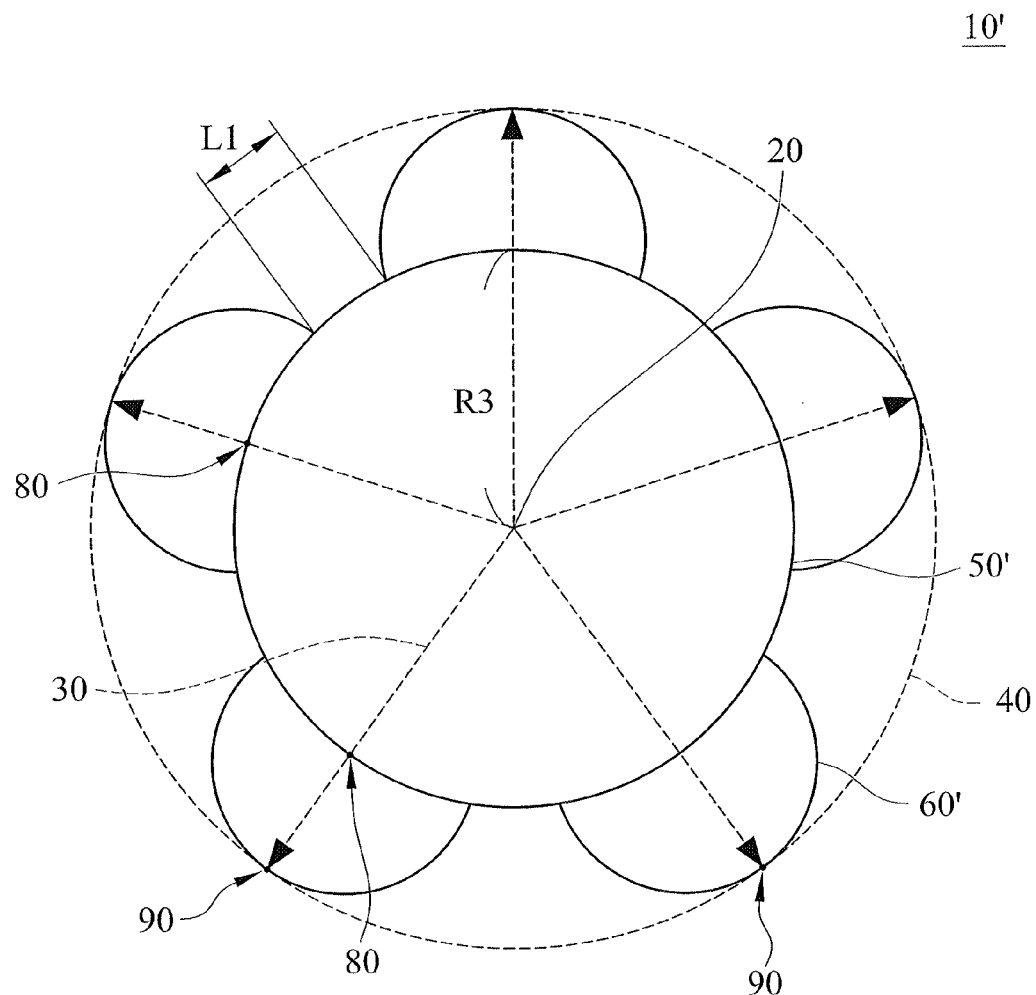
FIG. 16 schematically shows the third aspect of the N identical convex portions designed according to the present invention.
Figure 17:
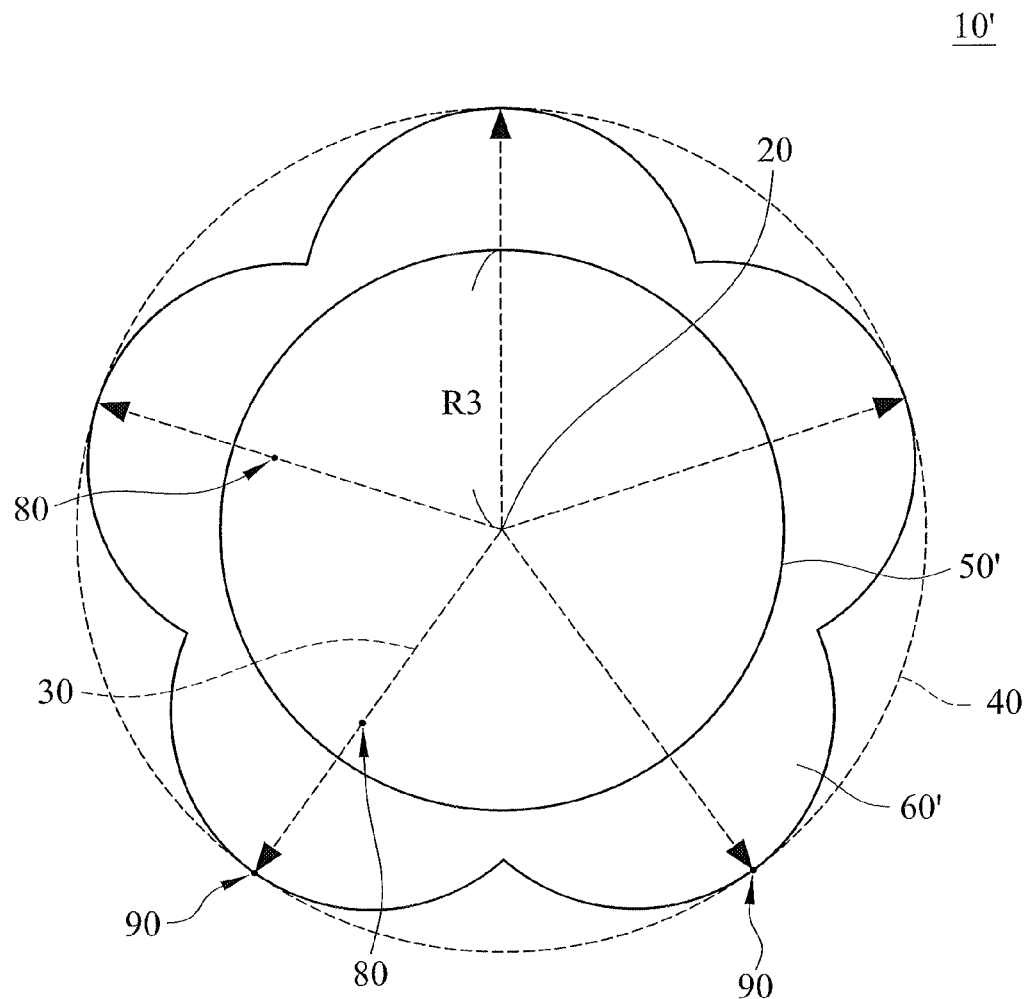
FIG. 17 schematically shows the fourth aspect of the N identical convex portions designed according to the present invention.

As shown in FIGS. 15 to 17, each convex portion 60 may be a portion of a cylinder. In addition, the distances between the center of circle 80 of the cross section of each such cylinder and the center 20 are the same, wherein the distances may be greater than, equal to, or less than R3. When the distances between the center of circle 80 of the cross section of each cylinder and the center 20 are greater than R3, the radius of curvature of each convex portion 60 is less than the distance between the circular design line 40 and the wire main body 50. When the distances between the center of circle 80 of the cross section of each cylinder and the center 20 are equal to R3, the radius of curvature of each convex portion 60 is equal to the distance between the circular design line 40 and the wire main body 50. When the distances between the center of circle 80 of the cross section of each cylinder and the center 20 are less than R3, the radius of curvature of each convex portion 60 is greater than the distance between the circular design line 40 and the wire main body 50.

The first radius R1 of the circular design line 40 may be less than 2 mm. When R1 is less than 0.134 mm and is greater than or equal to twice the distance between the circular design line 40 and the wire main body 50, and the radius of curvature of the cross section 60' of each convex portion is between 0.045 and 0.0475 mm, the spacing L1 between each two adjacent convex portions 60 as measured along the boundary of the cross section 50' of the wire main body is between 0.012 and 0.021 mm, and the vertical distance between any two parallel tangent lines to the boundary of the cross section 10' of the wire structure is between 0.125 and 2.01 mm.

Nonetheless, the distance between such parallel tangent lines may vary with product requirements. For example, the distance may be subject to the sole limitation that it must be less than 2.01 mm, or the distance may be as short as 0.125 mm when a smaller value is desired, or the distance may be even smaller in order to meet the requirements of product design. Also, a reduction in the distance may be accompanied by a change in the value of N. For instance, if the distance between such parallel tangent lines is further reduced, N can be set at three to facilitate the design and manufacture of the wire. Even though the wire structure 10 of the present invention may be ten times, a hundred times, or a thousand times thinner than a conventional wire, it can transfer and dissipate heat more efficiently.

In the wire structure 10 designed by the method described above, the wire main body 50 is a cylindrical main body, has a circular cross section 50' defined by the second radius R3, and is circumferentially provided with the N convex portions 60, wherein N is an odd number greater than or equal to three. Further, the centroid 70 of the cross section 60' of each convex portion is located on a corresponding one of the radial lines 30 radiating outward from the center 20 of the cross section 50' of the wire main body and may be shifted along the corresponding radial line 30, with the cross section 60' of each convex portion having the same radius of curvature, so as for the boundary of the cross section of each convex portion 60 and the circular design line 40 defined by the first radius R1 to meet at the corresponding apex 90.

Therefore, as long as the small-sized wire structure 10 has an odd number of convex portions 60, the cross section 10' of the wire structure can be vertically sandwiched between any two parallel lines and will contact with the two parallel lines at three contact points. Moreover, the vertical distance between the two parallel lines will be the same, regardless of the orientation in which the cross section 10' of the wire structure is sandwiched between the two parallel lines.

Even if a pair of parallel lines between which the cross section 10' of the wire structure is sandwiched contact with the cross section 10' at only two contact points, the error of the vertical distance between this pair of parallel lines will be within 3% of the vertical distance between a pair of parallel lines which contact with the cross section 10' sandwiched therebetween at three contact points.

As heat transfer in wire structures 10 of different sizes produces different heat dissipation effects, the shape of the convex portions 60 can be designed in accordance with product requirements to adjust the surface areas of different wire structures 10 for higher heat dissipation efficiency. By doing so, small-sized wire structures 10 are provided with increased commercial potential in practical use.

The features of the present invention are disclosed above by the preferred embodiments to allow persons skilled in the art to gain insight into the contents of the present invention and implement the present invention accordingly. The preferred embodiments of the present invention should not be interpreted as restrictive of the scope of the present invention. Hence, all equivalent modifications or amendments made to the aforesaid embodiments should fall within the scope of the appended claims.

What is claimed is:

1. A method for designing a wire structure, comprising the steps of:
   setting N radial lines which radiate equiangularly outward from a center of a cross section of a wire main body;
   setting a circular design line, wherein the circular design line has a center of circle defined by the center of the cross section of the wire main body and has a first radius (R1); and
   designing N identical convex portions, each having a cross section bilaterally symmetric with respect to a corresponding one of the radial lines, each said convex portion being an outward extension of the wire main body, the center of the cross section of the wire main body being equidistant from a centroid of the cross section of each said convex portion, the cross section of each said convex portion having an apex in contact with both the circular design line and the corresponding one of the radial line;
   wherein N is an odd number greater than or equal to three;
   wherein each said convex portion is defined by a circular arc, the circular arc being defined by a third radius (R2), and the at least three convex portions are tangent to an externally tangent circle defined by the first radius (R1) greater than or equal to twice the third radius (R2);
   wherein the first radius (R1) is less than 0.134 mm;
   wherein the third radius (R2) of the circular arc is between 0.045 and 0.0475 mm;
   wherein a vertical distance between any two parallel tangent lines to a boundary of a cross section of the wire structure is less than 2.01 mm.

2. The method of claim 1, wherein the wire main body is a cylindrical main body having a cross section defined by a center of circle and a second radius (R3), the center of circle of the cross section of the cylindrical main body being defined by the center of the cross section of the wire main body, the first radius (R1) being greater than the second radius (R3).

3. The method of claim 2, wherein each said convex portion is a portion of a cylinder, and a distance between a center of circle of a cross section of each said cylinder and the center of the cross section of the wire main body is the same and the distance between the center of circle of the cross section of each said cylinder and the center of the cross section of the wire main body is greater than the second radius (R3).

4. The method of claim 2, wherein each said convex portion is a portion of a cylinder, and a distance between a center of circle of a cross section of each said cylinder and the center of the cross section of the wire main body is the same and the distance between the center of circle of the cross section of each said cylinder and the center of the cross section of the wire main body is equal to the second radius (R3).

5. The method of claim 2, wherein each said convex portion is a portion of a cylinder, and a distance between a center of circle of a cross section of each said cylinder and the center of the cross section of the wire main body is the same and the distance between the center of circle of the cross section of each said cylinder and the center of the cross section of the wire main body is less than the second radius (R3).

6. A wire structure designed by the method of designing a wire structure, the steps of:
   setting N radial lines which radiate equiangularly outward from a center of a cross section of a wire main body;
   setting a circular design line, wherein the circular design line has a center of circle defined by the center of the cross section of the wire main body and has a first radius (R1); and
   designing N identical convex portions, each having a cross section bilaterally symmetric with respect to a corresponding one of the radial lines, each said convex portion being an outward extension of the wire main body, the center of the cross section of the wire main body being equidistant from a centroid of the cross section of each said convex portion, the cross section of each said convex portion having an apex in contact with both the circular design line and the corresponding one of the radial line;
   wherein N is an odd number greater than or equal to three;
   wherein each said convex portion is defined by a circular arc, the circular arc being defined by a third radius (R2), and the at least three convex portions are tangent to an externally tangent circle defined by the first radius (R1) greater than or equal to twice the third radius (R2);
   wherein the first radius (R1) is less than 0.134 mm;
   wherein the third radius (R2) of the circular arc is between 0.045 and 0.0475 mm;
   wherein a vertical distance between any two parallel tangent lines to a boundary of a cross section of the wire structure is less than 2.01 mm.

7. The wire structure of claim 6, wherein each said convex portion is a portion of a cylinder, and a distance between a center of circle of a cross section of each said cylinder and the center of the cross section of the wire main body is the same and the distance between the center of circle of the cross section of each said cylinder and the center of the cross section of the wire main body is greater than the second radius (R3).

8. The wire structure of claim 6, wherein each said convex portion is a portion of a cylinder, and a distance between a center of circle of a cross section of each said cylinder and the center of the cross section of the wire main body is the same and the distance between the center of circle of the cross section of each said cylinder and the center of the cross section of the wire main body is equal to the second radius (R3).

9. The wire structure of claim 6, wherein each said convex portion is a portion of a cylinder, and a distance between a center of circle of a cross section of each said cylinder and the center of the cross section of the wire main body is the same and the distance between the center of circle of the cross section of each said cylinder and the center of the cross section of the wire main body is less than the second radius (R3).

10. A wire structure defined between a first plane and a second plane parallel to the first plane, the wire structure comprising:
    a main body comprising a center and a periphery, wherein the center is defined by a centroidal axis of the main body, and the periphery is defined by a perimeter of the main body;
    and at least three convex portions which protrude from and are adjacently arranged around the periphery, at least one said convex portion being tangent to the first plane, at least two said convex portions being tangent to the second plane, wherein the number of the at least one convex portion tangent to the first plane is not equal to the number of the at least two convex portions tangent to the second plane;
    wherein each said convex portion is defined by a circular arc, the circular arc being defined by a third radius (R2), and the at least three convex portions are tangent to an externally tangent circle defined by a first radius (R1) greater than or equal to twice the third radius (R2);
    wherein the first radius (R1) is less than 0.134 mm;
    wherein the third radius (R2) of the circular arc is between 0.045 and 0.0475 mm
    wherein a distance (H1) between the first plane and the second plane is less than 2.01 mm.

11. The wire structure of claim 10, wherein the number of the at least three convex portions is an odd number.

12. The wire structure of claim 10, wherein the at least three convex portions are asymmetrically distributed about the center.

13. The wire structure of claim 10, wherein a junction between a said convex portion and an exposed portion of the periphery forms a bend point in a cross section of the wire structure.

14. The wire structure of claim 10, wherein the number of the at least three convex portions is five.

* * * * *